(12) United States Patent
Fan et al.

(10) Patent No.: US 7,821,112 B2
(45) Date of Patent: Oct. 26, 2010

(54) SEMICONDUCTOR DEVICE WITH WIRE-BONDING ON MULTI-ZIGZAG FINGERS

(75) Inventors: Wen-Jeng Fan, Hsinchu (TW); Yu-Mei Hsu, Hsinchu (TW)

(73) Assignee: Powertech Technology Inc, Hsinchu (TW)

( * ) Notice: Subject to any disclaimer, the term of this patent is extended or adjusted under 35 U.S.C. 154(b) by 481 days.

(21) Appl. No.: 12/044,990

(22) Filed: Mar. 9, 2008

(65) Prior Publication Data

US 2009/0224377 A1 Sep. 10, 2009

(51) Int. Cl.
*H01L 23/495* (2006.01)

(52) U.S. Cl. .................. 257/666; 438/121; 257/784; 257/E23.141; 257/E21.001; 257/670; 257/E23.043; 257/672; 257/676; 257/690; 257/E23.052; 257/669; 257/667; 257/777

(58) Field of Classification Search .................. 257/666, 257/784, E23.141, E21.001, 670, E23.043, 257/672, 676, 690, E23.052, 669, 667, 777; 438/121
See application file for complete search history.

(56) References Cited

U.S. PATENT DOCUMENTS

| | | | | |
|---|---|---|---|---|
| 5,072,281 A * | 12/1991 | Eytcheson | ................... | 257/666 |
| 5,150,194 A * | 9/1992 | Brooks et al. | ................ | 257/670 |
| 5,530,281 A * | 6/1996 | Groover et al. | ............. | 257/666 |
| 5,780,925 A * | 7/1998 | Cipolla et al. | ................ | 257/676 |
| 6,091,133 A * | 7/2000 | Corisis et al. | ................ | 257/666 |
| 6,208,023 B1 * | 3/2001 | Nakayama et al. | .......... | 257/696 |
| 6,307,272 B1 * | 10/2001 | Takahashi et al. | ........... | 257/787 |
| 6,534,849 B1 * | 3/2003 | Gang | .......................... | 257/678 |
| 6,995,459 B2 * | 2/2006 | Lee et al. | ..................... | 257/676 |
| 7,375,415 B2 * | 5/2008 | Lee et al. | ..................... | 257/666 |
| 7,453,138 B2 * | 11/2008 | Kawakami et al. | .......... | 257/666 |
| 7,612,436 B1 * | 11/2009 | Lee et al. | ..................... | 257/672 |
| 2003/0067059 A1 * | 4/2003 | Corisis | ........................ | 257/666 |
| 2006/0220191 A1 * | 10/2006 | Sundstrom | ................... | 257/669 |
| 2007/0001272 A1 * | 1/2007 | Lee et al. | ..................... | 257/666 |
| 2008/0036052 A1 * | 2/2008 | Do et al. | ...................... | 257/666 |
| 2008/0048301 A1 * | 2/2008 | Wang et al. | ................. | 257/666 |
| 2008/0073758 A1 * | 3/2008 | James | ........................ | 257/666 |
| 2009/0072416 A1 * | 3/2009 | Sano | .......................... | 257/784 |
| 2009/0302443 A1 * | 12/2009 | Wang et al. | ................. | 257/670 |
| 2010/0078793 A1 * | 4/2010 | Mess et al. | ................... | 257/686 |

* cited by examiner

*Primary Examiner*—Fernando L Toledo
*Assistant Examiner*—Ankush k Singal
(74) *Attorney, Agent, or Firm*—Muncy, Geissler, Olds & Lowe, PLLC

(57) ABSTRACT

A semiconductor device having linear zigzag(s) for wire bonding is revealed, primarily comprising a chip, a plurality of leads made of a lead frame and a plurality of bonding wires electrically connecting the chip and the leads. At least one of the leads has a linear zigzag including a first finger and a second finger connected each other in a zigzag form. One end of one of the bonding wire is bonded to a bonding pad on the chip and the other end is selectively bonded to either the first finger or the second finger but not both in a manner that the wire-bonding direction of the bonding wire is parallel to or in a sharp angle with the direction of the connected fingers for easy wire bonding processes. Therefore, the semiconductor device can assemble chips with diverse dimensions or with diverse bonding pads layouts by flexible wire-bonding angles at linear zigzag to avoid electrical short between the adjacent leads.

20 Claims, 8 Drawing Sheets

SEMICONDUCTOR DEVICE WITH WIRE-BONDING ON MULTI-ZIGZAG FINGERS

FIELD OF THE INVENTION

The present invention relates to a semiconductor device, especially to a leadframe-based semiconductor device with wire bonding at leads.

BACKGROUND OF THE INVENTION

In a conventional semiconductor device, a chip is attached to a chip carrier such as a lead frame or a substrate and is electrically connected to the chip carrier by a plurality of bonding wires where the chip carrier has a plurality of bonding fingers for wire-bonding. However, as the development of higher circuit densities, finer pad pitches, and smaller package dimensions, the width and the spacing between the bonding fingers become smaller and smaller leading to easily electrical short between bonding wires and adjacent fingers. Furthermore, the allowable spacing on a bonding finger for cutting wires also become smaller and smaller leading to difficulties of wire bonding. The existing solution is to specially design an exclusive chip carrier where its bonding fingers are arranged corresponding to the bonding pads of a chip with specific dimensions or with specific bonding pad layouts. Therefore, the chip carrier only can be used for one specific IC chip leading to higher packaging costs.

As shown in FIG. 1 and FIG. 2, a conventional semiconductor device 100 primarily comprises a plurality of first leads 110 and a plurality of second leads 150 made of a same leadframe, a chip 120, and a plurality of first bonding wires 131 and second bonding wires 132. Parts of the first leads 110 and the second leads 150 in the semiconductor device 100 are called internal leads including a plurality of bonding fingers 111 and 151 for wire bonding, respectively. The first leads 110 and the second leads 150 have a plurality of external leads extended from two opposing sides of the semiconductor device 100 respectively. As shown in FIG. 2 again, the bonding fingers 111 of the first leads 110 and the bonding fingers 151 of the second leads 150 are arranged in parallel and are divided from a spacing line S1 where the internal ends of the first lead 110 and the internal ends of the second leads 150 are disposed at two opposing sides of the spacing line S1. The length of the first lead 110 is longer than the one of the second lead 150 for disposing the chip 120. Some of the bonding pads 122 of the chip 120 are electrically connected to the bonding fingers 111 of the first leads 110 by the first bonding wires 131 and the other of the bonding pads 122 of the chip 120 are electrically connected to the bonding fingers 151 of the second leads 150 by the second bonding wires 132. The encapsulant 170 encapsulates the chip 120, the first bonding wires 131, the second bonding wires 132, the internal leads of the first leads 110 and the second leads 150 with the external leads of the first leads 110 and the second leads 150 exposed from two opposing sides of the encapsulant 170. As shown in FIG. 2, the layout of the bonding fingers 111 of the first leads 110 and the layout of the bonding fingers 151 of the second leads 150 are corresponding to the layout of the bonding pads 122 of the chip 120 to ensure the wire bonding directions of the first bonding wires 131 and the second bonding wires 132 are compliant to the extending directions of the bonding fingers 111 of the first leads 110 and the bonding fingers 151 of the second leads 150. Therefore, the semiconductor device 100 only can assemble a specific chip 120 with a specific chip dimension and a specific bonding pad layout as shown in FIG. 2. If a chip with different chip dimensions and/or with different bonding pad layouts are selected, the bonding wires are bonded to the fingers with a larger minimum angle even with cross wiring leading to easy electrical short with the adjacent bonding fingers or/and bonding wires during wire-bonding or molding processes.

SUMMARY OF THE INVENTION

The main purpose of the present invention is to provide a semiconductor device with wire bonding on linear zigzags to solve the problems mentioned above. Since linear zigzags provide alternatives for wire-bonding locations, the semiconductor device can be implemented for chips with different dimensions and/or with different bonding pad layouts with better wire-bonding qualities to eliminate a bonding wire electrically shorted to the adjacent bonding fingers or/and to the adjacent bonding wires.

The second purpose of the present invention is to provide a semiconductor device with wire bonding on linear zigzags. By a specific finger arrangement, the bonding wires connecting the leads at two opposing sides are of a similar length to lessen wire shift caused by different lengths of bonding wires during molding.

According to the present invention, a semiconductor device primarily comprises at least a first lead made of a lead frame, a chip, and a plurality of bonding wires. The first lead has a linear zigzag including a first finger and a second finger. The bonding wire electrically connects the bonding pad to the linear zigzag, wherein the end of the bonding wire on the linear zigzag is selectively bonded to either the first finger or the second finger but not both in a manner that the wire-bonding direction of the bonding wire is compliant to an extended central line of the wire-bonding finger selected from the first finger and the second finger. In the other word, a first minimum angle is formed between a wire-bonding direction of the bonding wire and an extended central line of the wire-bonding finger selected from the first finger and the second finger. A second minimum angle is formed between the wire-bonding direction of bonding wires and an extended central line of the non-wire bonding finger selected from the second finger and the first finger. The first minimum angle is not greater than the second minimum angle to achieve the compliance of wire-bonding connection at the linear zigzag. In different embodiments, a wiring substrate can be a chip carrier with the linear zigzag. The chip can be attached to the chip carrier and is electrically connected to either the first bonding finger or the second bonding finger of the linear zigzag but not both to form a semiconductor device.

DETAIL DESCRIPTION OF THE INVENTION

Please refer to the attached drawings, the present invention will be described by means of embodiments below.

Figure 1:
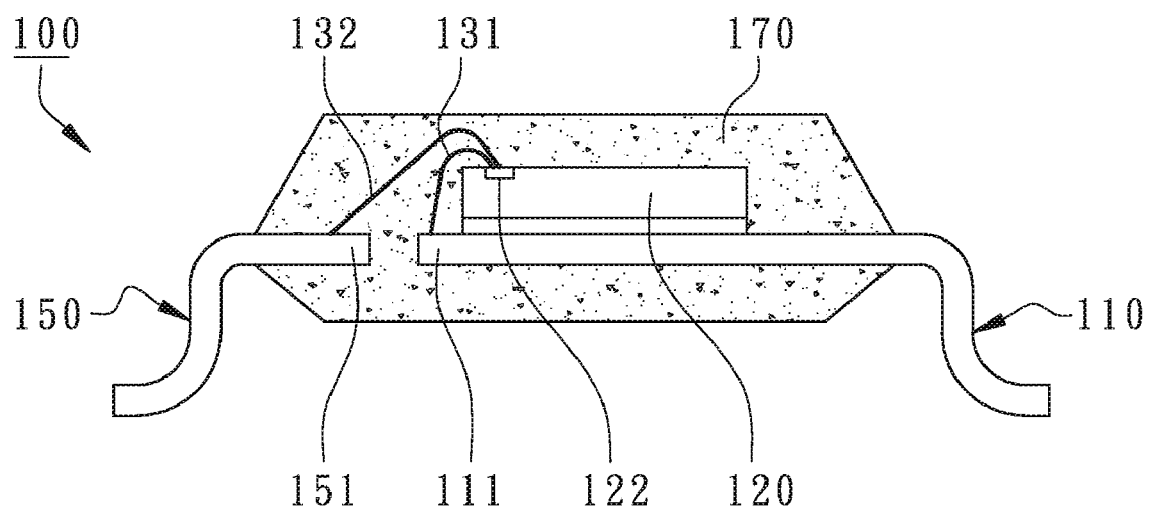
FIG. 1 shows a cross-sectional view of a conventional semiconductor device.
Figure 2:
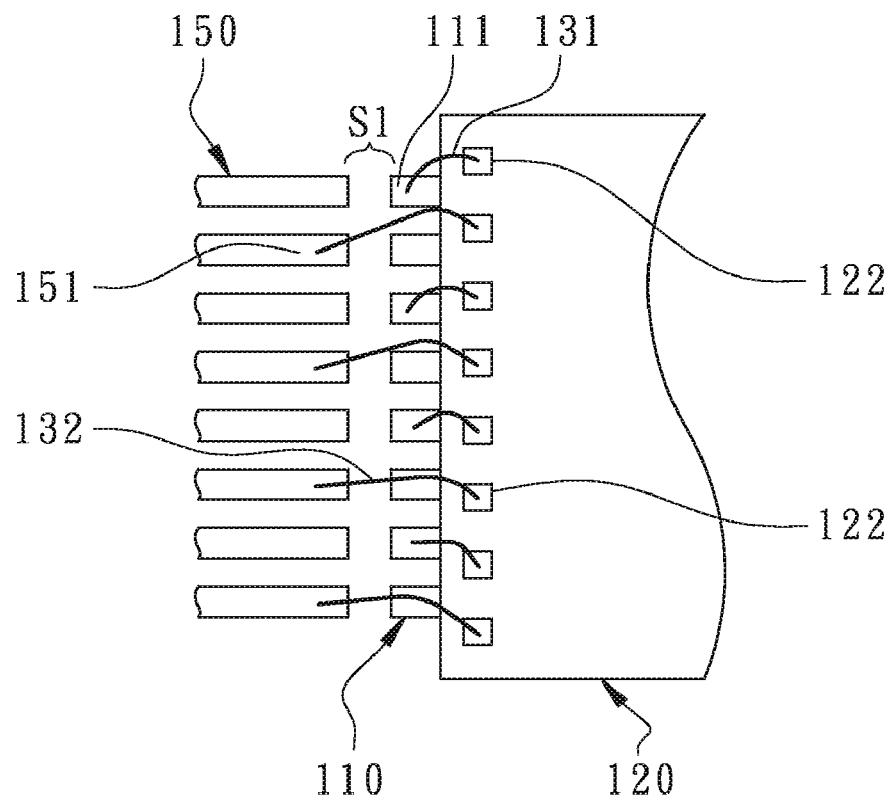
FIG. 2 shows a partial wire-bonding diagram between the active surface of a chip and the lead frame in the conventional semiconductor device before molding.
Figure 3:
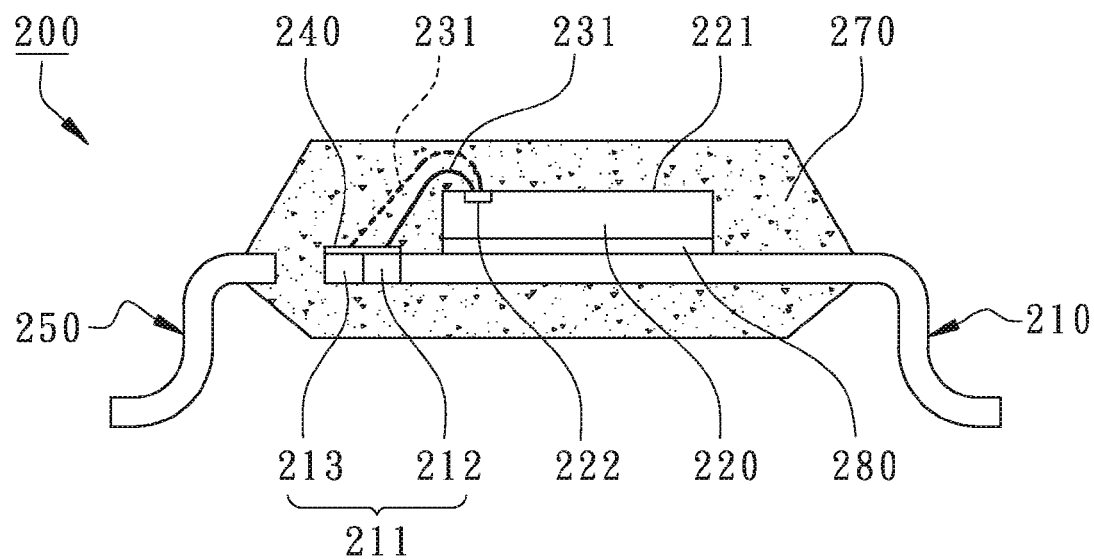
FIG. 3 shows a cross-sectional view of a semiconductor device along a first lead according to the first embodiment of the present invention.
Figure 4:
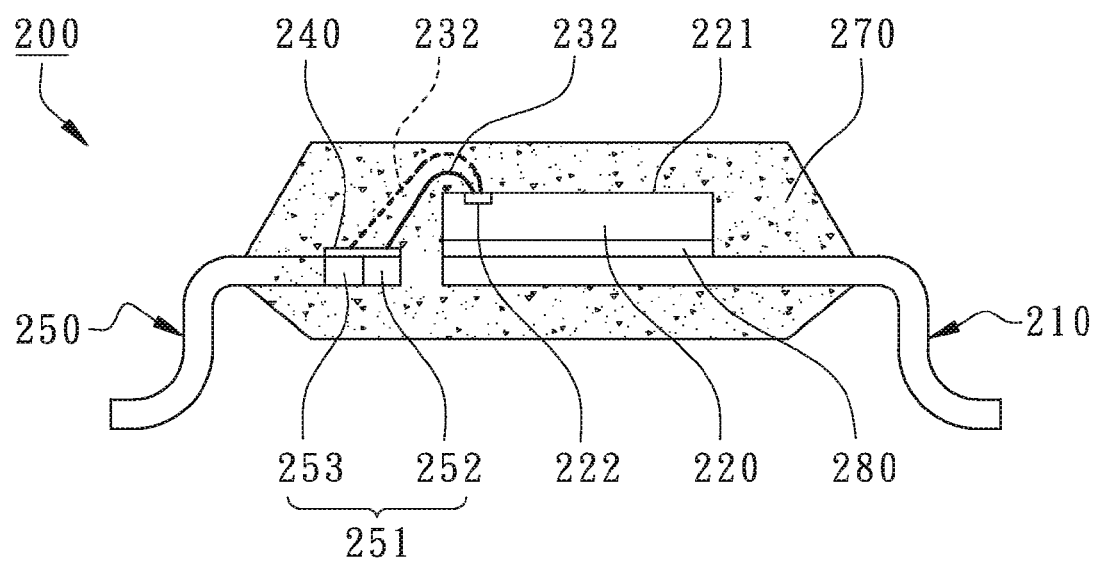
FIG. 4 shows a cross-sectional view of a semiconductor device along a second lead according to the first embodiment of the present invention.
Figure 5:
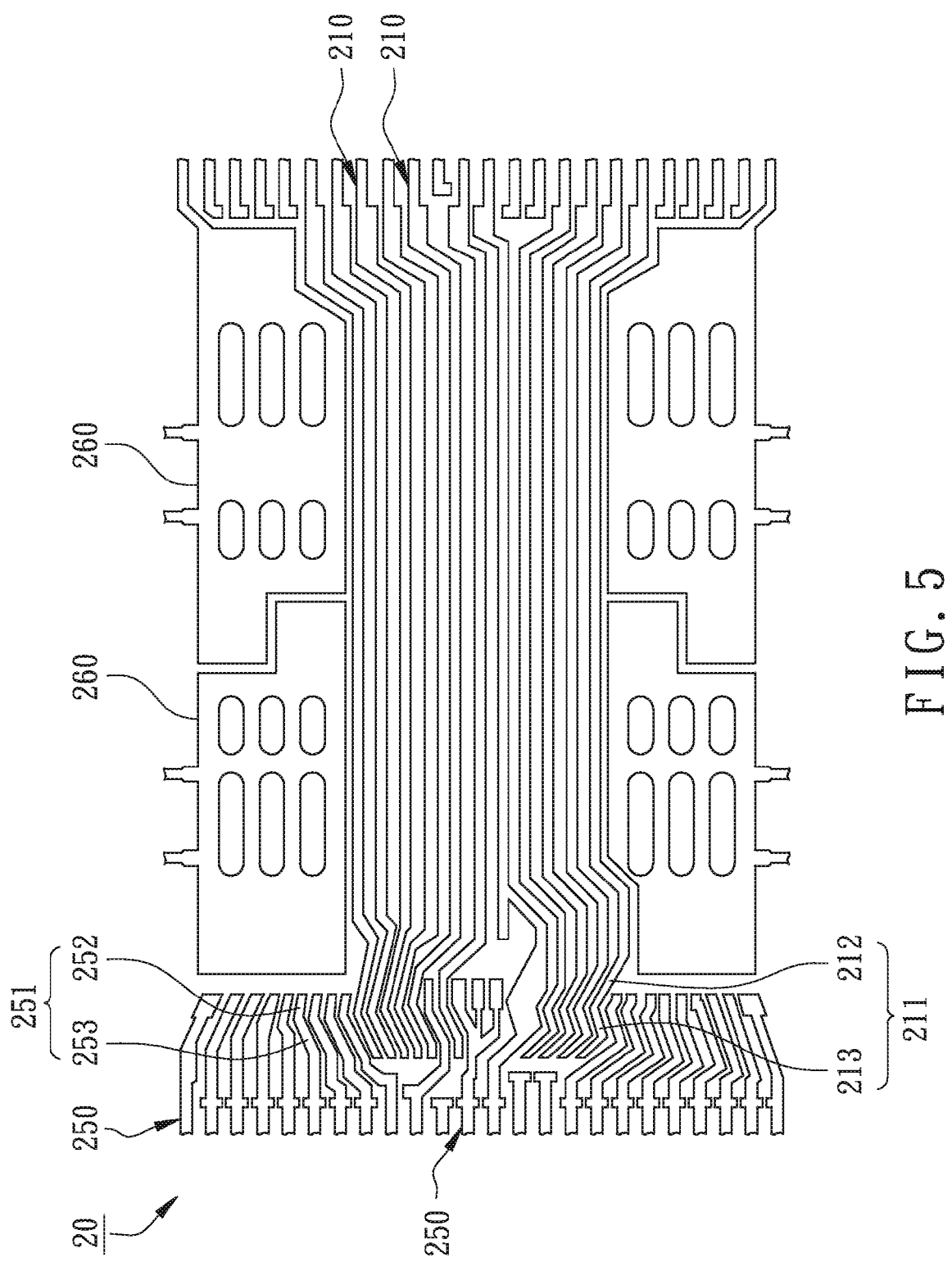
FIG. 5 shows a lead frame layout for the semiconductor device according to the first embodiment of the present invention.
Figure 6:
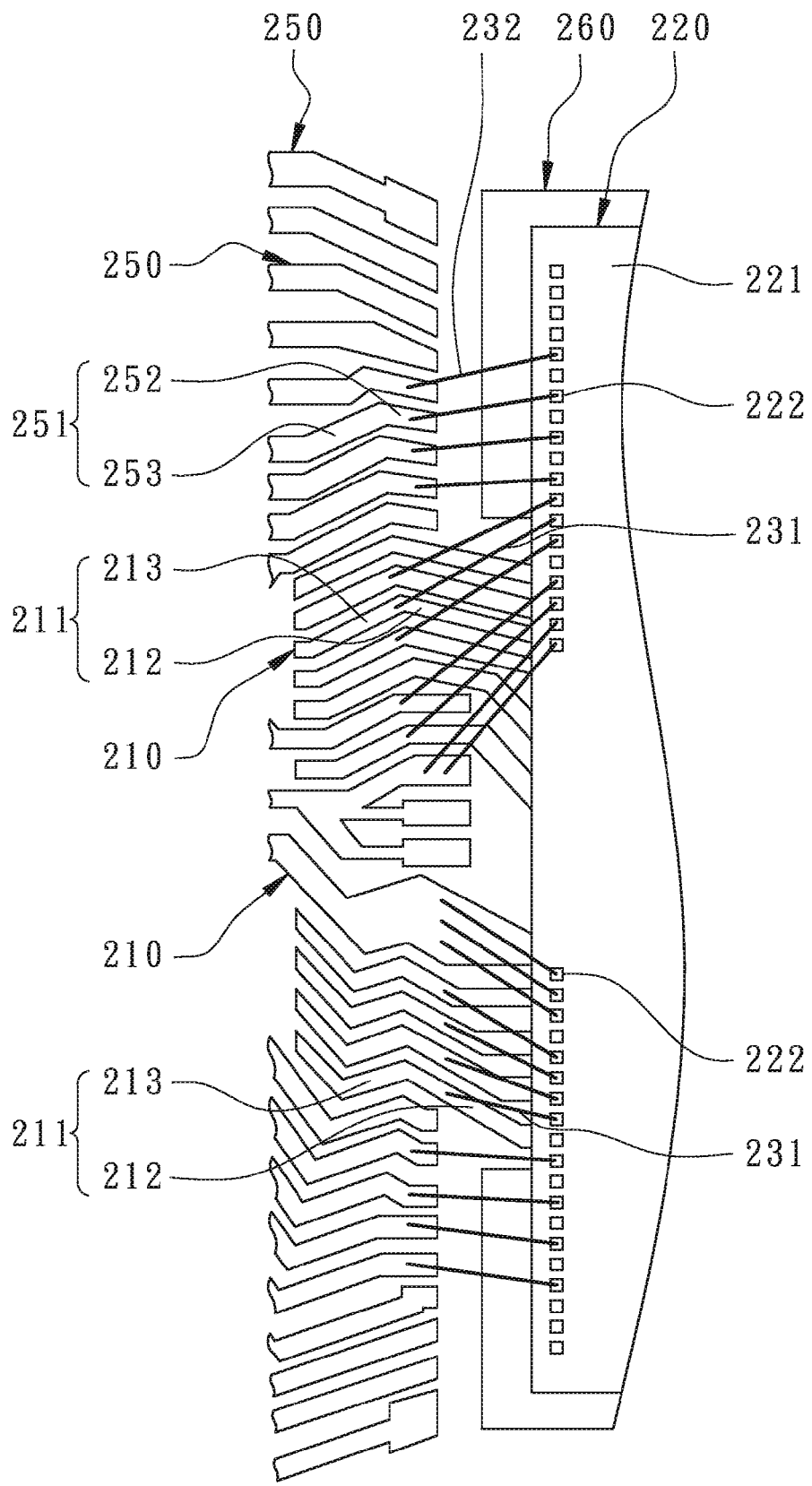
FIG. 6 shows a wire-bonding diagram between the active surface of a chip and the lead frame in the semiconductor device before molding according to the first embodiment of the present invention.

As shown in FIG. 3 and FIG. 4, a semiconductor device 200 primarily comprises a plurality of first leads 210, a chip 220, and a plurality of first bonding wires 231. Therein, the first leads 210 are made from a leadframe 20 as shown in FIG. 5. As shown in FIG. 5 and FIG. 6, each first lead 210 has a linear zigzag 211 including a first finger 212 and a second finger 213. The "zigzag" means a "V" zigzag bend is formed at the connection between the first finger 212 and the second finger 213. The zigzag bent angle is between 20 degrees to 90 degrees, wherein zero bent degree means the first finger 212 and the second finger 213 are formed in a straight line. The linear zigzags are of a shape selected from the group consisting of "Z", "V" and "W". In the present embodiment, the linear zigzags 211 can be shaped in "Z" with at least a zigzag. As shown in FIG. 3 and FIG. 6, the first finger 212 is close to the chip 220 relative to the second finger 213 to the chip 220. Each second finger 213 includes an internal end of the corresponding first lead 210.

As shown in FIG. 4 and FIG. 5, the semiconductor device 200 further comprises a plurality of second leads 250 of the lead frame 20. As shown in FIG. 3, the external leads of the second leads 250 and the external leads of the first leads 210 are disposed at two opposing sides of the semiconductor device 200. In the present embodiment, the external leads of the second leads 250 and the external leads of the first leads 210 are extended from the encapsulant 270 and are exposed from two opposing sides of the semiconductor device 200 respectively. The external leads are bent as gull leads or other shapes. Each second lead 250 has a third finger 252 where the third finger 252 and the first finger 212 are disposed in parallel and in stagger. As shown in the left of FIG. 5 and FIG. 6, the term "disposed in parallel and in stagger" means that the internal end of the first lead 210 is extended toward the second leads 250 and passing the third finger 252 so that the first fingers 212 are aligned to and mixed with the third fingers 252 for wire-bonding connections. At least one of the second leads 250 further has a fourth finger 253 connected with the third finger 252 in a zigzag form to form a linear zigzag 251, wherein the fourth finger 253 is adjacent and is arranged with the second finger 213 in parallel and in stagger. As shown in FIG. 3 and FIG. 5, the first leads 210 are longer than the second leads 250 by extending a central line of the semiconductor device 200 for attaching the chip 220. To be more specific, as shown in FIG. 3 again, the semiconductor device 200 further comprises a plating layer 240 formed on the surface of the linear zigzag 211 of the first lead 210 to cover the first finger 212 and the second finger 213 to enhance the bonding strength of the bonding wire 231. As shown in FIG. 4, the plating layer 240 is further formed on the surface of the linear zigzag 251 of the second lead 250 to cover the third finger 252 and the fourth finger 253. The materials of the plating layer 240 can be chosen from a group of silver, nickel-gold, tin, tin-palladium-gold, tin lead alloy, tin bismuth alloy, etc.

The chip 220 has an active surface 221 with a plurality of bonding pads 222 disposed on the active surface 221 as external electrodes for the chip 220. In the present embodiment, the bonding pads 222 are disposed at one of the sides of the chip 220 where the bonding pad layout, pad pitches, and pad spacing are very flexible. As shown in FIG. 6, in this embodiment, a large non-pad area can be reserved at the middle of the side of the chip 220 where the length of the non-pad area is larger than the average pitch of the bonding pads 222 so that the bonding pads can be divided into a top group of the bonding pads and a bottom group of the bonding pads. The chip 220 can be a flash memory or the other IC. As shown in FIG. 3 and FIG. 6, the chip 220 is attached onto the first leads 210 by a die-attaching material 280 with the active surface 221 of the chip 220 away from the first leads 210. As shown in FIG. 5 and FIG. 6, the lead frame 20 further has a plurality of metal paddles 260 located on both opposing sides of the first leads 210 to reinforce the die-attaching strength. As shown in FIG. 3, the first bonding wires 231 electrically connect some of the bonding pads 222 to some linear zigzags 211 of the first leads 210. As shown in FIG. 4, a plurality of second bonding wires 232 electrically connect the other of the bonding pads 222 to the linear zigzags 251 of the second leads 250.

Figure 7:
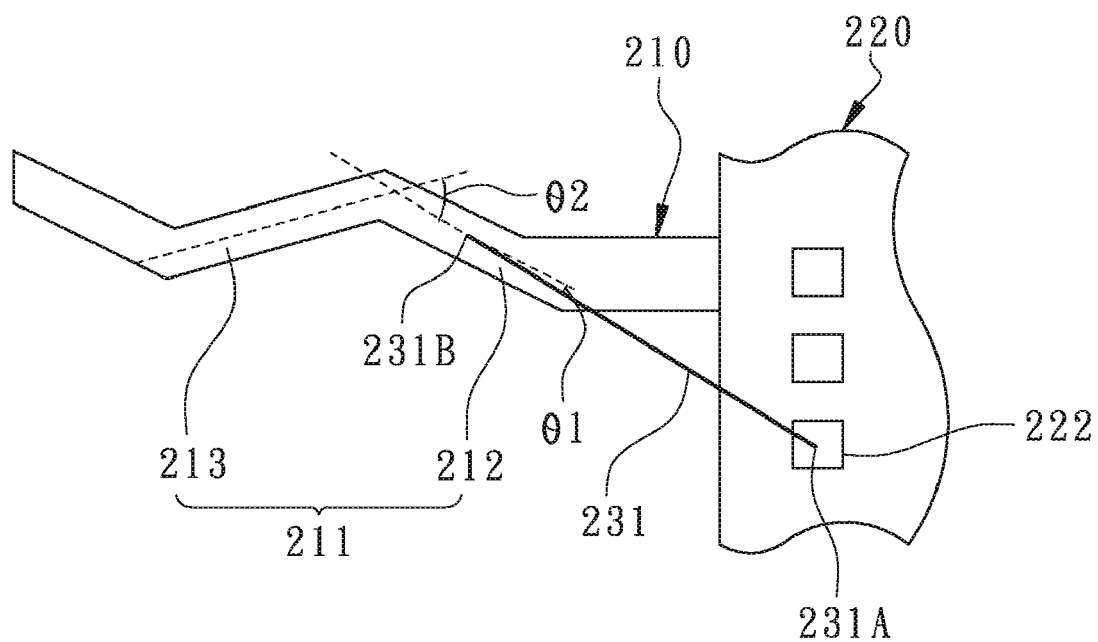
FIG. 7 shows a wire-bonding diagram of one first lead in the semiconductor device by wire-bonding from the bonding pad to a selectable location (first finger) of a linear zigzag of the first lead according to the first embodiment of the present invention.
Figure 8:
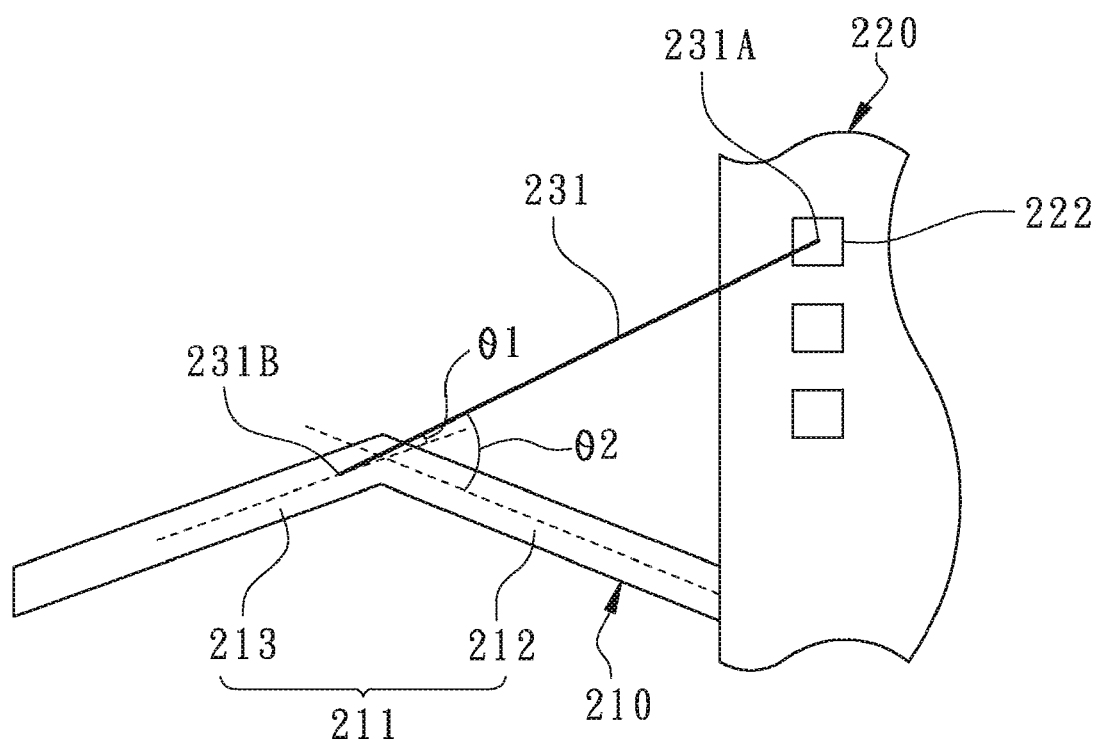
FIG. 8 shows a wire-bonding diagram of another first lead in the semiconductor device by wire-bonding from the bonding pad to a selectable location (second finger) of a linear zigzag of the first lead according to the first embodiment of the present invention.

As shown in FIG. 6, FIG. 7, and FIG. 8, each first bonding wire 231 has a first bond 231A on the bonding pad 222 and a second bond 231B on the linear zigzags 211 of the first leads 210. Therein, the second bond 231B of the first bonding wire 231 is selectively bonded to either the first finger 212 or the second finger 213 of the corresponding first lead 210 but not both. In the present embodiment, the first bond 231A is the initial wire-bonding bond (normally called as a ball bond) and the second bond 231B is the final wire-bonding point (normally called as a stitch bond), i.e., the bonding wire 231 is formed by a forward wire bonding from the chip 220 to the linear zigzag 211 of the first lead 210. However, the first bonding wire 231 can be a reverse wire bonding from the bonding fingers of the lead frame to the chip. In the present invention, forward wire bonding is preferred.

As shown in FIG. 7 and FIG. 8 again, a first minimum angle $\theta_1$ is formed between the wire-bonding direction of the first bonding wire 231 and an extended central line of the wire-bonding finger selected from the first finger 212 and the second finger 213. A second minimum angle θ2 is formed between the wire-bonding direction of the first bonding wire 231 and an extended central line of the non-wire bonding finger selected from the second finger 213 and the first finger 212. The first minimum angle θ1 is not greater than the second minimum angle θ2. When two straight lines are crossed, there are two equal obtuse angles and two equal acute angles, wherein the first and second minimum angles mentioned above are acute angles. Usually, the first minimum angle θ1 ranges from 0 to 60 degrees, the second minimum angle θ2 ranges from 20 to 90 degrees.

In the present invention, the term of "wire-bonding direction" means the horizontal direction on the lead frame 20 from the first bond 231A of the first bonding wire 231 on the chip 220 to the second bond 231B on the linear zigzag 211, as shown in FIG. 7 and FIG. 8.

As shown in FIG. 7 again, according to location of the bonding pad 222 relative to the connected linear zigzag 211, the first finger 212 is selected. The first bond 231A of one of the first bonding wires 231 is bonded to the corresponding bonding pad 222, the second bond 231B of the first bonding wire 231 is bonded to the first finger 212 of the first lead 210 where the first minimum angle θ1 is not greater than the second minimum angle θ2. As shown in FIG. 8, according to location of the bonding pad 222 relative to the connected linear zigzag 211, the second finger 213 is selected. The first bond 231A of another one of the first bonding wires 231 is bonded to the corresponding bonding pad 222, the second bond 231B of the first bonding wire 231 can be bonded to the second finger 213 of the corresponding first lead 210 where the first minimum angle θ1 is still not greater than the second minimum angle θ2. Therefore, the first finger 212 and the second finger 213 can provide the flexibility of wire bonding location to achieve a better wire-bonding angle for the first bonding wires 231 to avoid electrical short between the adjacent fingers or bonding wires. As shown in FIG. 7 and FIG. 8 again, preferably, the first minimum angle θ1 can approach zero degree so that the wire-bonding direction of the first bonding wire 231 is almost parallel to the extended central line of the wire-bonding finger selected from the first finger 212 and the second finger 213 for perfect alignment. Accordingly, the wire-bonding directions of the first bonding wires 231 are compliant to the extended central lines of the wire-bonding fingers selected from the first fingers 212 and the second fingers 213.

Figure 9:
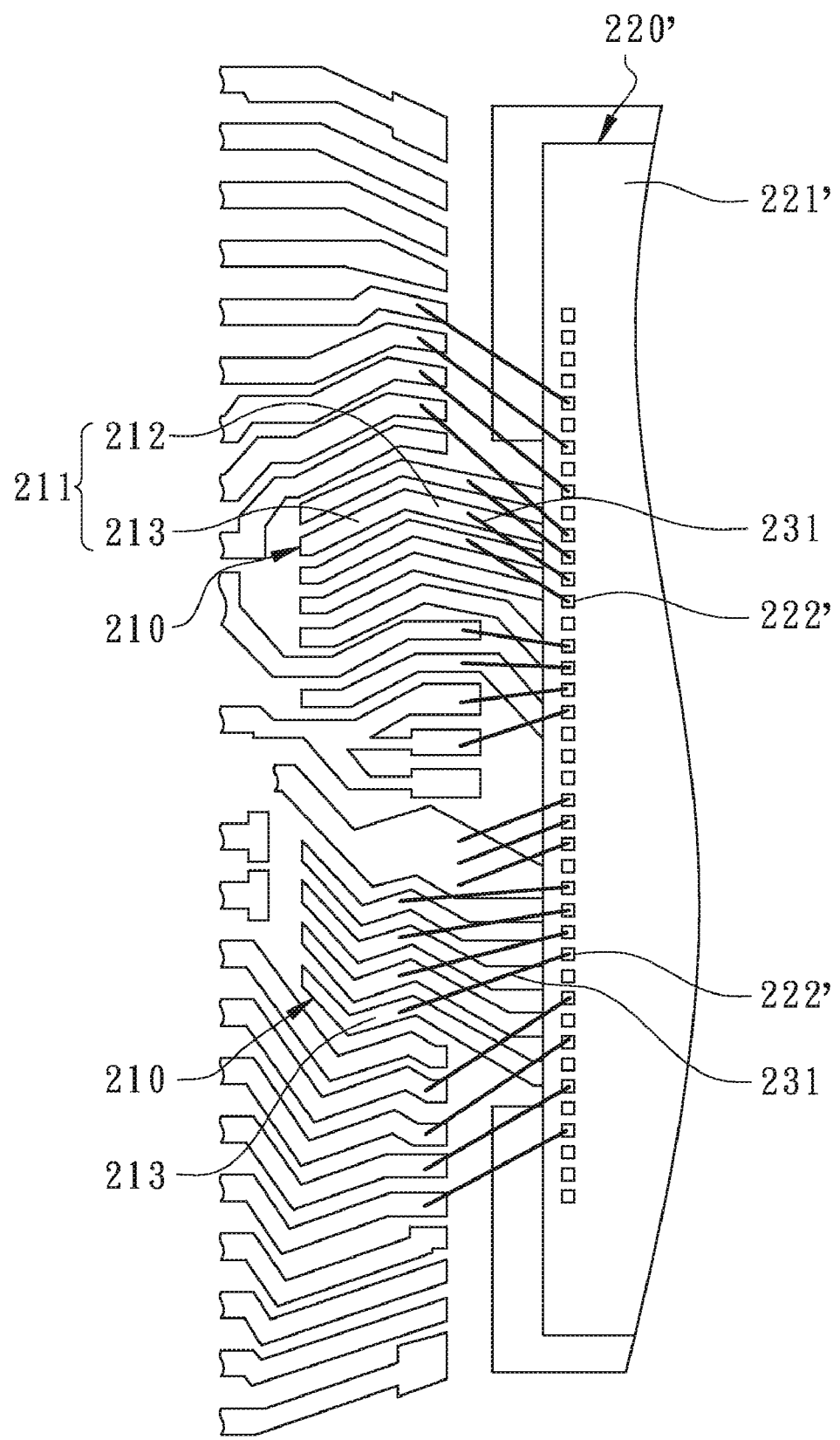
FIG. 9 shows another wire-bonding diagram between the active surface of another chip having different bonding pad layouts and the lead frame in the semiconductor device before molding according to the first embodiment of the present invention.

The semiconductor device 200 can assemble different chips with diverse bonding pad layouts or with diverse chip dimensions. As shown in FIG. 9, another chip 220' is disposed on the lead frame 20. The plurality of bonding pads 222' of the chip 220' are disposed on one side of the active surface 221' of the chip 220' without non bonding-pad area between the bonding pads 222'. The first bonding wires 231 with the better wire-bonding angles bonded from the bonding pads 222' of the chip 220' are bonded to either the first fingers 212 or the second fingers 213 of the corresponding linear zigzags 211 of the first leads 210 but not both for electrical connections in a manner that the first minimum angle θ1 is always not greater than the second minimum angle θ2. Therefore, the wire-bonding selectivity between the first fingers 212 and the second fingers 213 of the first leads 210 can provide better wire-bonding angles for the first bonding wire 231 for chips with different bonding pad layouts to avoid electrical short between the adjacent fingers 212 and 213.

As shown in FIG. 4 and FIG. 6, a plurality of second bonding wires 232 electrically connect the bonding pads 222 of the chip 220 to either the third fingers 252 or the fourth fingers 253 of the linear zigzags 251 of the second leads 250 but not both. Since the linear zigzags 251 of the second leads 250 including the fourth fingers 253 and the third fingers 252 are staggered with the linear zigzags 211 of the first leads 210, this lead layout can provide better wire-bonding angles for the second bonding wires 232. Normally, the second bonding wires 232 are bonded to the third fingers 252 adjacent to the chip 220 to reduce the length of bonding wire when the first minimum angle θ1 is similar to the second minimum angle θ2. As shown in FIG. 5 and FIG. 6, even though the first leads 210 and the second leads 250 are disposed on the opposing sides of the lead frame 20, but the linear zigzags 211 of the first leads 210 and the linear zigzags 251 of the second leads 250 can be disposed in parallel and in stagger with the internal ends of the first leads 210 extended to the second leads 250 passing the internal ends of the second leads 250 so that the bonding area of the first fingers 212 and the bonding area of the third fingers 252 are parallel and the bonding area of the second fingers 213 and the bonding area of the fourth fingers 253 are also parallel. Therefore, the length of the first bonding wires 231 is about the same as the one of the second bonding wires 232.

To be more specific, the semiconductor device 200 further comprises an encapsulant 270 to encapsulate the chip 220, the first bonding wires 231, the second bonding wires 232, the linear zigzags 211 of the first leads 210 and the linear zigzags 251 of the second leads 250 where the external leads of the first leads 210 and the external leads of the second leads 250 are extended and exposed from the opposing sides of the encapsulant 270 for SMT.

Therefore, each linear zigzag 211 of the first lead 210 offers a better wire-bonding selection by bonding to either the first fingers 212 or the second fingers 213 but not both to provide better wire-bonding angles to avoid electrical short between the first bonding wires 231 and the adjacent linear zigzags 211. Moreover, the first leads 210 also can provide better wire-bonding angles for chips with different dimensions or with different bonding pad layouts so that semiconductor device 200 also can assemble chips with different dimensions or with different bonding pad layouts. Furthermore, since the distance from the linear zigzags 211 of the first leads 210 to the bonding pads 222 is about the same as the distance from the linear zigzags 251 of the second leads 250 to the bonding pads 222, therefore, the lengths of the first bonding wires 231 are about the same as the ones of the second bonding wires 232. Since the length of the bonding wires are well controlled, therefore, even if the first bonding wires 231 and the second bonding wires 232 experience wire sweep during molding, electrical short between the adjacent bonding wires due to different lengths of bonding wires is avoided.

Figure 10:
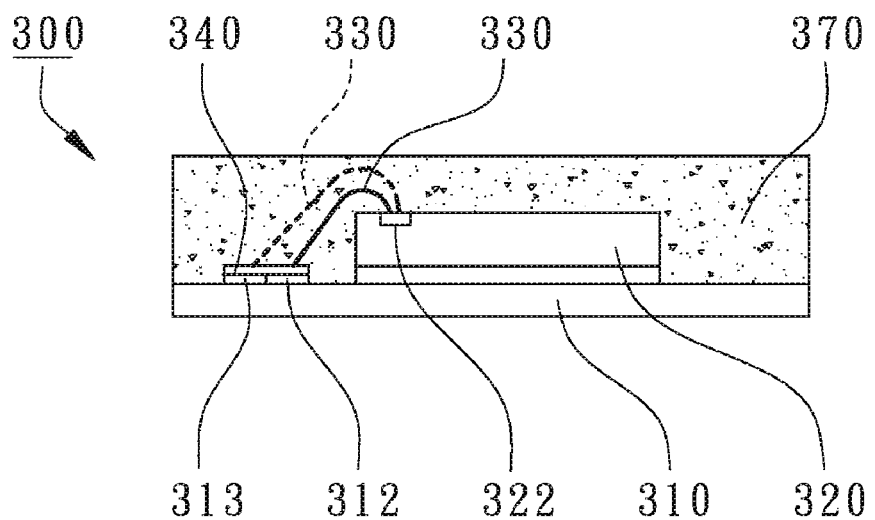
FIG. 10 shows a cross-sectional view of another semiconductor device with linear zigzags according to the second embodiment of the present invention.
Figure 11:
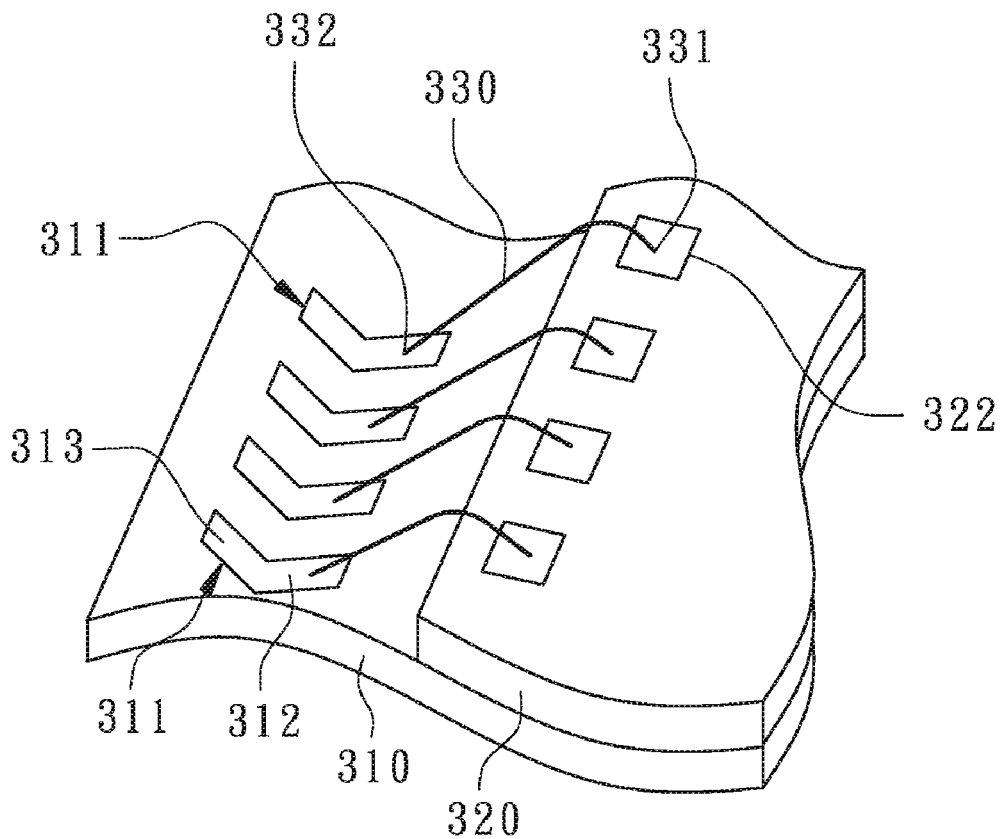
FIG. 11 shows a partial three-dimensional wire-bonding diagram between the active surface of a chip having first bonding pad layouts and the chip carrier in the semiconductor device before molding according to the second embodiment of the present invention.
Figure 12:
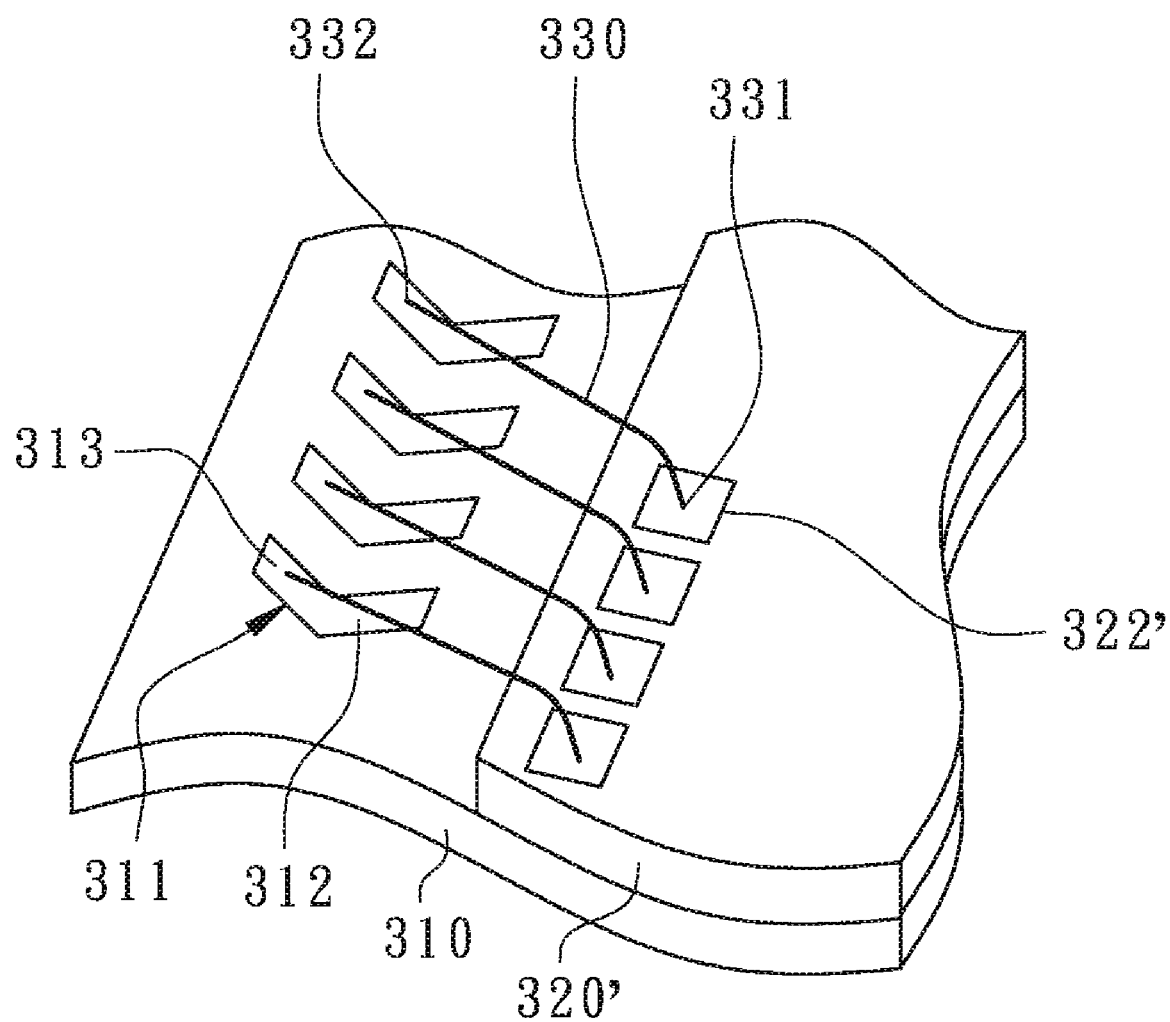
FIG. 12 shows a partial three-dimensional wire-bonding diagram between the active surface of another chip having second bonding pad layouts and the chip carrier in the semiconductor device before molding according to the second embodiment of the present invention.

In the second embodiment of the present invention, another semiconductor device with linear zigzags is revealed as shown in FIG. 10. A semiconductor device 300 comprises a chip carrier 310, a chip 320, and a plurality of bonding wires 330. In the present embodiment, the chip carrier 310 can be a wiring substrate, such as PCB. As shown in FIG. 11 and FIG. 12, the chip carrier 310 has a plurality of linear zigzags 311 where each linear zigzag 311 has a first finger 312 and the second finger 313 connected each other in a zigzag form. A plating layer 340 is formed on the linear zigzags 311 to cover the first finger 312 and the second finger 313. The chip 320 with a plurality of bonding pads 322 is attached to the chip carrier 310. As shown in FIG. 10 and FIG. 11, the first bonds 331 of the bonding wires 330 are bonded to the bonding pads 222 and the second bonds 332 of the bonding wires 330 are bonded to the linear zigzags 311. Therein, the second bonds 332 of the bonding wires 330 on the linear zigzags 311 are optional. Each second bond 332 can be selectively bonded to either the first finger 312 or the second finger 313 of a corresponding linear zigzag 311 but not both in a manner that a wire-bonding direction of the bonding wire 330 is compliant to an extended central line of the wire-bonding finger selected from the first finger 312 and the second finger 313. Accordingly, a first minimum angle formed between the wire-bonding direction of the first bonding wire 330 and the extended central line of the wire-bonding finger selected from the first finger 312 and the second finger 313 is not greater than a second minimum angle formed between the wire-bonding direction of the bonding wire 330 and an extended central line of the non-wire bonding finger selected from the second finger 313 and the first finger 312. When the first minimum angle is about the same as the second minimum angle, the bonding wire 330 is connected to the first finger 312 to shorten the length of the bonding wire 330. In this embodiment, the first fingers 312 are selected for wire bonding.

Therefore, the semiconductor device 300 can assemble chips with different bonding pad layouts and provide better wire-bonding angles to avoid electrical short between the adjacent bonding fingers. As shown in FIG. 12, another chip 320' is disposed on the chip carrier 310. A plurality of bonding pads 322' of the chip 320' are electrically connected to the linear zigzags 311 of the chip carrier 310 by the plurality of bonding wires 330 where the bonding wires 330 are bonded to the bonding pads 322' and the second finger 313 so that the wire-bonding directions of the bonding wires 330 is compliant to the extended central lines of the bonded second finger 313. To be more specific, the semiconductor device 300 further has an encapsulant 370 formed on the top surface of the chip carrier 310 to encapsulate the chip 320, the bonding wires 330 and the linear zigzags 311. Therefore, the semiconductor device 300 can assemble different chip having diverse pad layouts and diverse dimensions on the chip carrier 310 having fine pitches of the linear zigzags 311.

The above description of embodiments of this invention is intended to be illustrative and not limiting. Other embodiments of this invention will be obvious to those skilled in the art in view of the above disclosure.

What is claimed is:

1. A semiconductor device primarily comprising:
   at least a first lead having a linear zigzag including a first finger and a second finger connected each other in a zigzag form;
   a chip having a bonding pad; and
   a bonding wire electrically connecting the bonding pad to the linear zigzag, wherein the bonding wire is selectively bonded to either the first finger or the second finger of the linear zigzag but not both in a manner that a first minimum angle formed between a wire-bonding direction of the bonding wire and an extended central line of the wire-bonding finger selected from the first finger and the second finger is not greater than a second minimum angle formed between the wire-bonding direction of the bonding wire and an extended central line of the non-wire bonding finger selected from the second finger and the first finger.

2. The semiconductor device as claimed in claim 1, wherein the first minimum angle is almost zero degree so that the wire-bonding direction of the bonding wire is parallel to the extended central line of the wire-bonding finger.

3. The semiconductor device as claimed in claim 1, wherein the first finger is close to the chip relative to the second finger to the chip.

4. The semiconductor device as claimed in claim 1, wherein the linear zigzag is of a shape selected from the group consisting of "Z", "V" and "W".

5. The semiconductor device as claimed in claim 1, further comprising a plating layer formed on the linear zigzag.

6. The semiconductor device as claimed in claim 1, further comprising a plurality of metal paddles located on two sides of the first lead, and wherein the chip is attached to the first lead and the metal paddles.

7. The semiconductor device as claimed in claim 1, wherein the chip has a plurality of bonding pads disposed on one side of the chip with a non-pad area located at the middle of the side.

8. The semiconductor device as claimed in claim 1, wherein one end of the bonding wire on the linear zigzag is a stitch bond.

9. The semiconductor device as claimed in claim 3, wherein the second finger includes an internal end of the first lead.

10. The semiconductor device as claimed in claim 9, further comprising at least a second lead having a third finger adjacent and arranged with the first finger in parallel and in stagger wherein the third finger includes an internal end of the second lead.

11. The semiconductor device as claimed in claim 10, wherein the second lead further has a fourth finger connected with the third finger in a zigzag form wherein the fourth finger adjacent and arranged with the second finger in parallel and in stagger.

12. The semiconductor device as claimed in claim 10, wherein the first lead is longer than the second lead and extends to the second lead, and wherein the chip is attached to the first lead.

13. The semiconductor device as claimed in claim 12, further comprising an encapsulant encapsulating the chip, the bonding wire, the linear zigzag of the first leads including the non-wire bonding finger and at least a portion of the second leads including the third finger, and wherein an external lead of the first lead and an external lead of the second lead are extended and exposed from two opposing sides of the encapsulant.

14. A semiconductor device primarily comprising:
   a chip carrier having at least a linear zigzag including a first finger and a second finger connected each other in a zigzag form;
   a chip disposed on the chip carrier and having a bonding pad; and
   a bonding wire electrically connecting the bonding pad and the linear zigzag, wherein the bonding wire is selectively bonded to either the first finger or the second finger of the linear zigzag but not both in a manner that a wire-bonding direction of the bonding wire is compliant to an extended central line of the wire-bonding finger selected from the first finger and the second finger.

15. The semiconductor device as claimed in claim 14, wherein the chip carrier is a wiring substrate.

16. The semiconductor device as claimed in claim 14, wherein the first minimum angle is almost zero degree so that the wire-bonding direction of the bonding wire is parallel to the extended central line of the wire-bonding finger.

17. The semiconductor device as claimed in claim 14, wherein the linear zigzag is of a shape selected from the group consisting of "Z", "V" and "W".

18. The semiconductor device as claimed in claim 14, wherein the first finger is close to the chip relative to the second finger to the chip.

19. The semiconductor device as claimed in claim 14, further comprising a plating layer formed on the linear zigzag.

20. The semiconductor device as claimed in claim 18, wherein, the bonding wire is bonded to the first finger to shorten the wire-bonding length when the first minimum angle is almost equal to the second minimum angle.

* * * * *